United States Patent
Roy et al.

(10) Patent No.: US 8,597,528 B1
(45) Date of Patent: Dec. 3, 2013

(54) METHOD AND SYSTEM FOR DEFINING A READ SENSOR USING AN ION MILL PLANARIZATION

(75) Inventors: Anup G. Roy, Fremont, CA (US); Ming Mao, Dublin, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 323 days.

(21) Appl. No.: 13/076,103

(22) Filed: Mar. 30, 2011

(51) Int. Cl.
   *B44C 1/22* (2006.01)
(52) U.S. Cl.
   USPC ............................................. 216/22; 360/59
(58) Field of Classification Search
   None
   See application file for complete search history.

(56) References Cited

U.S. PATENT DOCUMENTS

| | | | |
|---|---|---|---|
| 4,460,434 A * | 7/1984 | Johnson et al. | 204/192.34 |
| 4,662,985 A | 5/1987 | Yoshida et al. | |
| 5,091,048 A | 2/1992 | Thomas | |
| 5,744,400 A | 4/1998 | Dyer | |
| 5,953,578 A | 9/1999 | Lee | |
| 6,004,473 A * | 12/1999 | Hsiao et al. | 216/22 |
| 6,238,582 B1 * | 5/2001 | Williams et al. | 216/22 |
| 6,288,357 B1 | 9/2001 | Dyer | |
| 2007/0253117 A1 * | 11/2007 | Takei et al. | 360/313 |
| 2011/0116184 A1 * | 5/2011 | Yasui et al. | 360/59 |
| 2012/0125884 A1 * | 5/2012 | Chung et al. | 216/22 |

FOREIGN PATENT DOCUMENTS

JP    61289635    12/1996

OTHER PUBLICATIONS

Devasahayam, Hard Disk Drives: Magnetic head processing technology for small form-factor hard drives, Sep. 1, 2005, Solid State Technology.*

* cited by examiner

*Primary Examiner* — Binh X Tran
*Assistant Examiner* — David Cathey, Jr.

(57) ABSTRACT

A method and system for fabricating a magnetic transducer is described. A magnetic junction is defined from the magnetoresistive stack. The magnetic junction has a top and a plurality of sides. The step of defining the magnetic junction redeposits a portion of the magnetoresistive stack and forms fencing adjacent to the top of the magnetic junction. At least one hard bias structure is provided after the magnetic junction is defined. A first portion of the at least one hard bias structure is substantially adjacent to the magnetoresistive junction in a track-width direction. The magnetic junction is ion beam planarized, thereby substantially removing the fencing.

15 Claims, 7 Drawing Sheets

METHOD AND SYSTEM FOR DEFINING A READ SENSOR USING AN ION MILL PLANARIZATION

BACKGROUND

Figure 1:
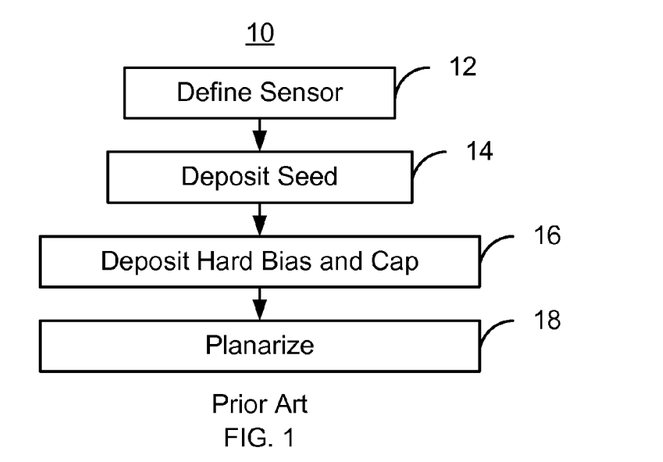
FIG. 1 is a flow chart depicting a conventional method for fabricating a magnetic recording transducer.
Figure 2:
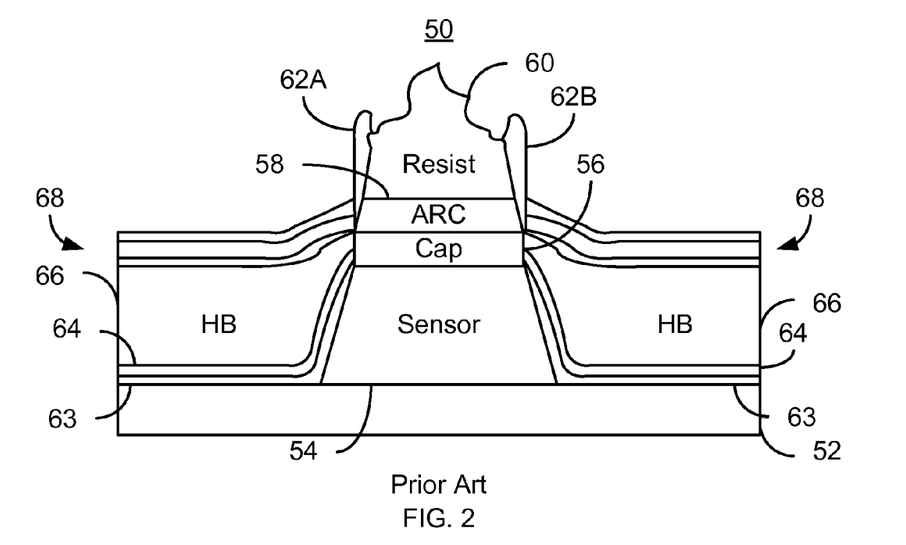
FIGS. 2-3 depict ABS views of a conventional magnetic recording transducer during fabrication.
Figure 3:
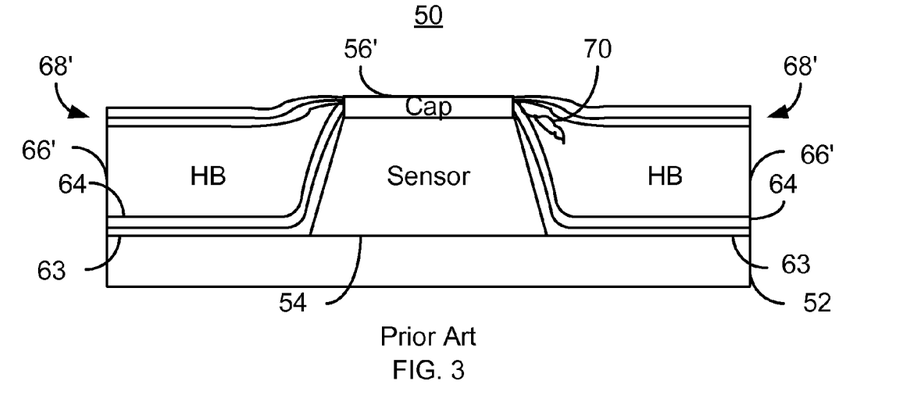

FIG. 1 depicts a conventional method 10 for fabricating a magnetoresistive sensor in magnetic recording technology applications. FIGS. 2-3 depict a conventional transducer 50 during fabrication using the method 10. FIGS. 2-3 are not to scale. The method 10 typically commences after a conventional magnetoresistive, or MR, stack has been deposited.

A conventional MR sensor is defined, via step 12. This typically includes providing at least a photoresist mask and may include the use of a hard mask. Forming the photoresist mask using conventional photolithography also typically includes using an antireflective coating (ARC) layer under the photoresist mask. The seed layer, hard bias layer, and hard bias capping layer are deposited, via step 14 and 16. FIG. 2 depicts an ABS view of the conventional transducer 50 after step 16 is performed. The conventional magnetoresistive stack 54 typically includes an antiferromagnetic (AFM) layer, a pinned layer, a nonmagnetic spacer layer, and a free layer. Also shown is a capping layer 56. In addition, seed layer(s) may be used. The conventional magnetoresistive sensor 54 resides on an underlayer 52, which may be a substrate. Also shown is the photoresist mask 60. A seed layer 64, hard bias material(s) 66 and capping layer(s) 68 that form the hard bias structures are shown. Also shown is insulating layer 63 between the hard bias structure and the sensor 54. Capping layer(s) 68 typically include Ru and Ta sublayers and are currently on the order of about twenty nanometers or more in thickness. Also shown are fencing/redeposition 62A and 62B. The fencing/redeposition 62A and 62B are formed when the sensor is defined in step 12.

A chemical mechanical planarization (CMP) is performed, via step 18. The CMP performed in step 18 smoothes the topography, particularly that due to the photoresist mask 60 and fencing 62A and 62B. FIG. 3 depicts the conventional transducer 50 after step 18 is performed. The CMP is configured to remove fencing/redeposition 62A and 62B, and generally to planarize the conventional transducer 50. Thus, portions of the capping layers 56 and 68 have been removed, leaving portions 56' and 68', respectively. Photoresist mask 60 has also been removed.

Although the conventional method 10 allows the conventional transducer 50 to be fabricated, there are drawbacks. During and after the CMP performed in step 18, sensitive portions of the conventional transducer 50 may be exposed. For example, the hard bias 66' shown in FIG. 3 may be subjected to corrosive chemicals. The materials used in the hard bias structures and the topology shown in FIG. 2 may result in uncontrolled removal of portions of the hard bias structure, such as the capping layer 68, near the sensor 54. As a result, corrosion 70 may be formed. The corrosion 70 may degrade the performance of the hard bias 66' and thus the conventional transducer 50. Corrosion that also adversely affects performance might also exist in the free layer, pinned layer, and pinning layer (not specifically delineated in FIGS. 2-3). As the conventional read sensor 54 becomes narrower and/or the stripe height (perpendicular to the plane of the page in FIG. 3) shorter, such issue may increase in frequency and/or severity.

Accordingly, what is needed is a system and method for improving the fabrication of a magnetic recording read transducer.

BRIEF SUMMARY OF THE INVENTION

A method and system for fabricating a magnetic transducer is described. A magnetic junction is defined from the magnetoresistive stack. The magnetic junction has a top and a plurality of sides. The step of defining the magnetic junction redeposits a portion of the magnetoresistive stack and forms fencing adjacent to the top of the magnetic junction. At least one hard bias structure is provided after the magnetic junction is defined. A first portion of the at least one hard bias structure is substantially adjacent to the magnetoresistive junction in a track-width direction. The magnetic junction is ion beam planarized, thereby substantially removing the fencing.

DETAILED DESCRIPTION OF THE PREFERRED EMBODIMENTS

Figure 4:
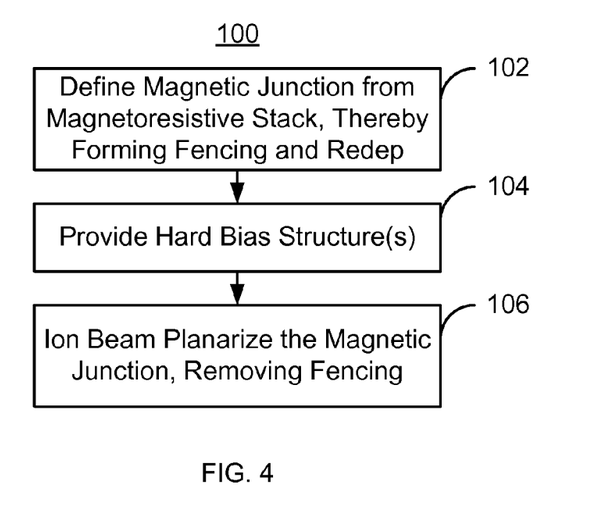
FIG. 4 is a flow chart depicting an exemplary embodiment of a method for fabricating a magnetic recording transducer.

FIG. 4 is an exemplary embodiment of a method 100 for providing a magnetic recording transducer. For simplicity, some steps may be omitted, interleaved, or combined. The method 100 is also described in the context of providing a single recording transducer. However, the method 100 may be used to fabricate multiple transducers at substantially the same time. The method 100 is also described in the context of particular layers. A particular layer may include multiple materials and/or multiple sub-layers. The method 100 also may start after formation of other portions of the magnetic recording transducer. For example, the method 100 commences after deposition of magnetoresistive layer(s) for a magnetoresistive stack. The magnetoresistive layers may include at least a pinning layer, a pinned layer, a nonmagnetic spacer layer, and a free layer. In addition, seed and/or capping layers may be used. The pinning layer may be an AFM or other layer configured to fix, or pin, the magnetization of the pinned layer. The pinned layer may be a synthetic antiferromagnetic (SAF) layer including magnetically coupled ferromagnetic layers separated by a nonmagnetic layer. The ferromagnetic layers may be termed pinned and reference sub-layers. The nonmagnetic spacer layer may be a conductive layer for a giant magnetoresistive structure, an insulator for a tunneling magnetoresistive structure, or may have another structure. The free layer is ferromagnetic and has a magnetization that is free to change in response to an external magnetic field, for example from a media. The free layer may have multiple sub-layers, as may the pinned and reference sub-layers. Further, although described in the context of a magnetoresistive junction, the method 100 may be applicable to formation of other structures for which fencing is desired to be removed.

The magnetoresistive junction is defined from the magnetoresistive stack, via step 102. Step 102 typically includes forming a mask covering a portion of the magnetoresistive stack and removing an exposed portion of the magnetoresistive stack. In some embodiments, the removal step includes performing an ion mill at a milling angle substantially normal (perpendicular) to the surface of the magnetoresistive stack. During this step, a portion of the magnetoresistive stack is redeposited. Thus, fencing may be formed near, or adjacent to, the top of the magnetoresistive junction and redeposited materials collected in this and other regions. In some embodiments, the fencing adjoins the top of the magnetic junction being formed. In some embodiments, step 102 defines the magnetic junction in the track width direction. However, in other embodiments, step 102 may defined the magnetoresistive junction in the stripe height direction, which is perpendicular to the ABS.

At least one hard bias structure may be provided after the magnetic junction is defined, via step 104. Step 104 may be performed after defining the magnetoresistive junction in the track width direction. However, step 104 may be performed before defining the magnetoresistive junction in the stripe height direction with an insulation layer, or an insulating layer and a hard bias structure, or an insulating layer and other magnetic structure substantially adjacent to it. A first portion of the hard bias structure(s) is substantially adjacent to the magnetoresistive junction in a track-width direction. Step 104 generally includes depositing an insulating layer, one or more seed layers, hard bias material(s), and a capping layer including one or more sublayers. For example, the capping layer may include a Ru/Ta or Ta/Ru bilayer or Ru/Ta/Ru or Ta/Ru/Ta trilayer. In some embodiments, such a capping layer has a thickness that does not exceed twenty nanometers. In other embodiments in which a magnetoresistive junction is not the structure provided, then step 104 may be omitted or replaced with an analogous step that forms components around the structure being defined. A remaining portion of the photoresist mask may be removed, for example via lift-off, after the hard bias structure(s) are provided.

The magnetic junction is ion beam planarized, via step 106. As a result of the ion beam planarization, the fencing is substantially removed without the use of a CMP. In some embodiments, the ion beam planarization includes depositing a sacrificial layer that covers the magnetic junction, the fencing, and the hard bias structure(s). The sacrificial layer is a solid and has an ion milling removal rate that depends upon the milling angle. For example, the sacrificial layer might include one or more of Ta, Ru, Ti, W, Cr, TiW, and $Al_2O_3$. In some embodiments, the sacrificial layer has a thickness of at least ten Angstroms and not more than one hundred fifty Angstroms. In some such embodiments, the sacrificial layer is at least twenty and not more than sixty Angstroms. The sacrificial layer is desired to be thin enough that the topography due to the fencing/redeposition desired to be removed is still present. In some embodiments, the sacrificial layer might include sublayers. However, in other embodiments, the sacrificial layer is a single layer. After depositing of the sacrificial layer, such an embodiment may also include ion milling the magnetic transducer at a milling angle for which the removal rate is lower for the sacrificial layer on the top surface of the hard bias structures but higher for the sacrificial layer on the fencing. In other words, the milling angle may result in a low milling rate for sacrificial layer on the top surface of the hard bias structure and a high milling rate for the sacrificial layer on the fencing. Similarly, the ion milling rate for other structures protruding from the surface of the hard bias structure is desired to be high. For example, the milling rate for the fencing formed in step 102 may be higher than for material(s) on the top surface of the hard bias structures. In some embodiments, this milling angle is at least fifty degrees from a normal to a surface of the magnetic transducer. In some such embodiments, this milling angle is at least seventy degrees. At least part of the sacrificial material on the fencing/redeposition is removed. Further, portions of the fencing/redeposition are removed. However, the sacrificial layer on the top surface of the hard bias structure helps to protect other portions of the transducer from damage. In step 106, deposition of additional sacrificial layer(s) may be alternated with milling the transducer at an appropriate angle a particular number of times until the fencing is removed. Thus, in at least some embodiments, the fencing formed in step 102 may be removed in step 106 without the use of a CMP and without damage to adjacent structures.

Figure 5:
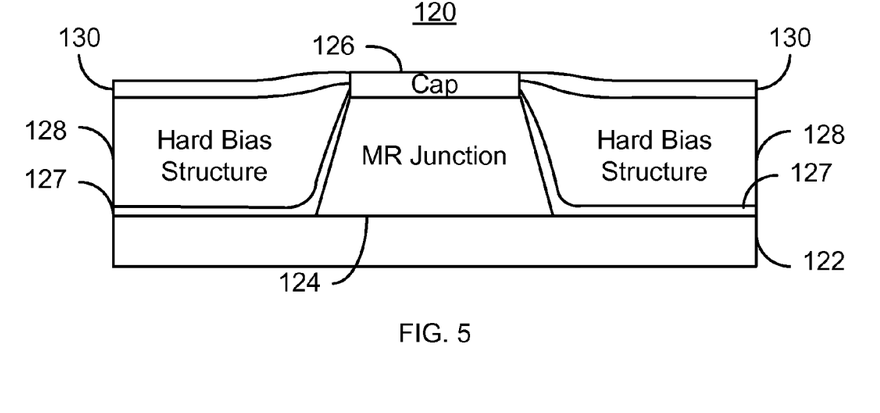
FIG. 5 depicts an ABS view of an exemplary embodiment of a magnetic recording transducer fabricated using the method.

FIG. 5 depicts an ABS location view of a transducer 120 formed using the method 100. For clarity, FIG. 5 is not to scale. The ABS location is the position at which the ABS will be located once fabrication of the transducer 120 is completed. Thus, an underlayer, such as a nonmagnetic gap layer 122 and magnetic junction 124 are shown. The magnetoresistive junction 124 may include an AFM layer, a pinned layer, a nonmagnetic spacer layer, and a free layer. Other layers, such as additional pinned and spacer layers may also be used. In addition, seed layer(s) (not shown) and/or capping layer(s) 130 may be provided. Also shown are insulating layer 127 and hard bias structures 128. The hard bias structures 128 may include seed layers (not shown) as well as capping layers 130.

Using the method 100, fabrication of a transducer such as the transducer 120 may be improved. As can be seen in FIG. 5, substantially no fencing remains near the magnetoresistive junction 124 even though a CMP has not been performed. This fencing has been removed using the ion beam planarization in step 106. The sacrificial layers (not shown) on remaining portions of the transducer 120, such as the hard bias structure 128 and capping layer(s) 130 may help protect such structures from damage. The ion beam planarization has thus left enough of the capping layers 126 and 130 remaining that the hard bias structures 128 and magnetoresistive junction 124 may be protected. Consequently, issues due to corrosion may be mitigated or eliminated. Further the ion beam planarization has resulted in a relatively flat top surface for the transducer 120. Thus, fabrication of the transducer 120 may be completed.

Figure 6:
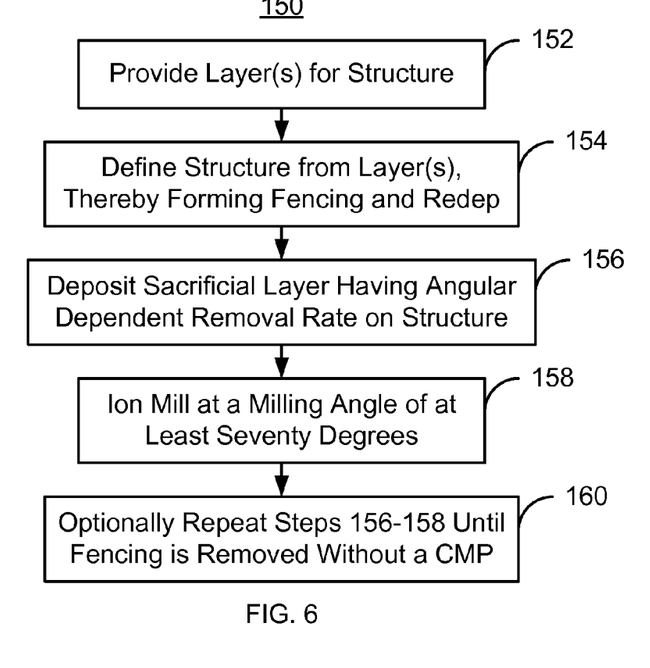
FIG. 6 is a flow chart depicting an exemplary embodiment of a method for fabricating a magnetic recording transducer.

FIG. 6 is an exemplary embodiment of a method 150 for providing structure in a microelectronic device. Such a microelectronic device might include a magnetic transducer. Such a structure may include a magnetoresistive junction. However, other analogous devices and structure might be fabricated using the method 150. For simplicity, some steps may be omitted, interleaved, or combined. The method 150 is also described in the context of providing a structure in a single microelectronic device. However, the method 150 may be used to fabricate multiple structures and/or multiple microelectronic devices at substantially the same time. The method 150 is also described in the context of particular layers. A particular layer may include multiple materials and/or multiple sub-layers. The method 150 also may start after formation of other portions of the microelectronic device.

The layer(s) for the structure are provided, via step 152. Step 152 may include depositing one or more layers for the structure to be fabricated. For example, in the event that the structure being fabricated is a magnetoresistive junction, step 152 may include depositing AFM, a pinned layer, a nonmagnetic spacer layer, a free layer, and a capping layer.

The structure is defined from the layer(s), via step 154. Step 154 typically includes forming a mask covering a portion of the layer(s) and removing an exposed portion of the layer(s). In some embodiments, the removal step may include performing an ion mill at a milling angle substantially normal to the surface of the magnetoresistive stack. During this step, a portion of the layer(s) is redeposited. Thus, fencing may be formed near the top of the structure being formed and redeposited materials collected in this and other regions. In some embodiments, the fencing adjoins the top of the structure being formed. Also in step 154, the mask(s) used in defining the structure may be removed.

A sacrificial layer that covers the structure defined in step 154, the fencing, and optionally, any adjoining components is provided, via step 156. The sacrificial layer is solid and has an ion milling removal rate that depends upon the milling angle. For example, the sacrificial layer might include one or more of Ta, Ru, Ti, W, Cr, TiW, and $Al_2O_3$. In some embodiments, the sacrificial layer has a thickness of at least ten Angstroms and not more than one hundred fifty Angstroms. In some such embodiments, the sacrificial layer is at least twenty and not more than sixty Angstroms. The thickness of the sacrificial layer is such that the fencing/redeposition formed in step 152 is not only covered, but raised above the surrounding topography. In some embodiments, the sacrificial layer might include sublayers. In other embodiments, the sacrificial layer is a single layer.

The microelectronic device is milled at a milling angle for which the removal rate for the sacrificial layer and the fencing/redeposition is high and for which the removal rate for the complement of the milling angle is low, via step 158. In some embodiments, this milling angle is at least fifty degrees from a normal to a surface of the magnetic transducer. In some such embodiments, this milling angle is at least seventy degrees. The sacrificial material on the fencing/redeposition is removed. Further, portions of the fencing/redeposition are removed. However, the sacrificial layer on the top surface of the microelectronic device helps to protect other portions of the microelectronic device from damage.

In at least some embodiments, the fencing formed in step 152 may be removed in step 158 without the use of a CMP. However, in other embodiments, the fencing/redeposition might not be completely removed. Consequently, steps 156-158 may be optionally repeated until the fencing/redeposition is removed, via step 160. Thus, deposition of additional sacrificial layer(s) may be alternated with milling the transducer at an appropriate angle a particular number of times until the fencing is removed. As part of step 158 or 160, any remaining sacrificial material might be removed. Thus, fencing/redeposition may be removed without the use of a CMP.

Using the method 150, fabrication of a microelectronic device may be improved. In particular, fencing may be removed using the ion beam planarization performed using step 156-160. This removal may be accomplished substantially without damage to adjacent structures. Further, the top surface of the microelectronic device may be planarized. Consequently, fabrication of the structures in the microelectronic device may be improved.

Figure 7:
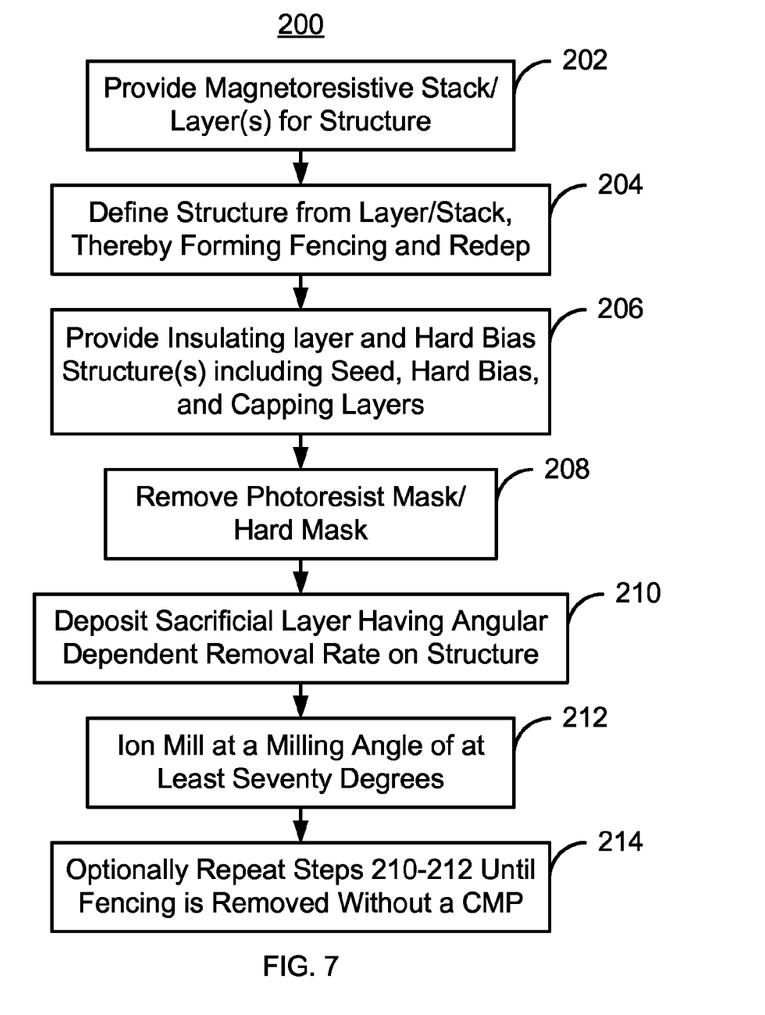
FIG. 7 is a flow chart depicting an exemplary embodiment of a method for fabricating a magnetic recording transducer.

FIG. 7 is a flow chart depicting another exemplary embodiment of a method 200 for fabricating a magnetic recording transducer. FIGS. 8-12 depict plan and ABS views of another exemplary embodiment of a magnetic recording transducer 250 during fabrication. For clarity, FIGS. 8-12 are not to scale. The method 200 is described in the context of the transducer 250. For simplicity, some steps of the method 200 may be omitted, combined, or interleaved. The method 200 is also described in the context of providing a single recording transducer 250. However, the method 200 may be used to fabricate multiple transducers at substantially the same time. The method 200 and transducer 250 are also described in the context of particular layers. A particular layer may include multiple materials and/or multiple sub-layers. The method 200 also may start after formation of other portions of the magnetic recording transducer 250.

The magnetoresistive stack for the magnetoresistive sensor is provided, via step 202. The magnetoresistive layers may include a pinning layer, a pinned layer, a nonmagnetic spacer layer, and a free layer. In addition, seed and/or capping layers may be deposited in step 202. Examples of such layers are described above.

Figure 8:
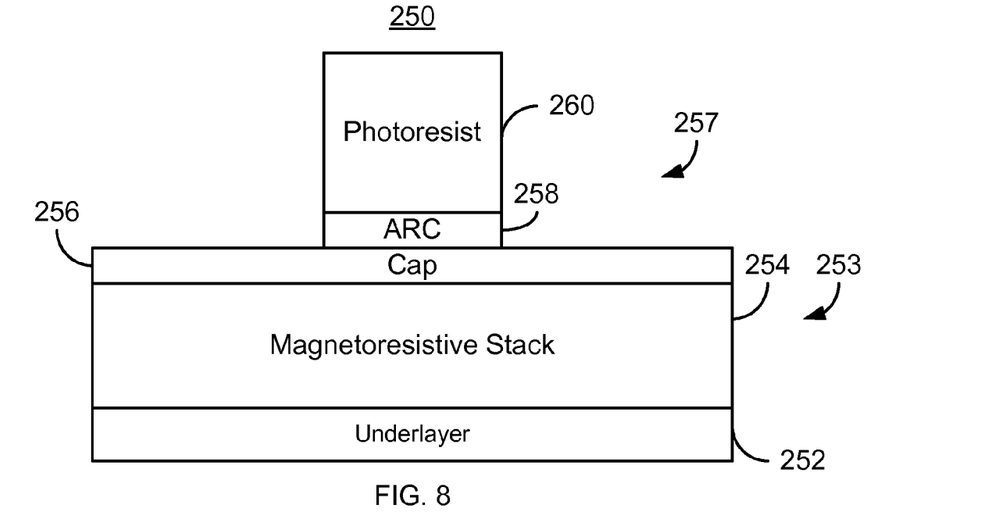
FIGS. 8-12 depict ABS views of an exemplary embodiment of a magnetic recording transducer during fabrication.
Figure 9:
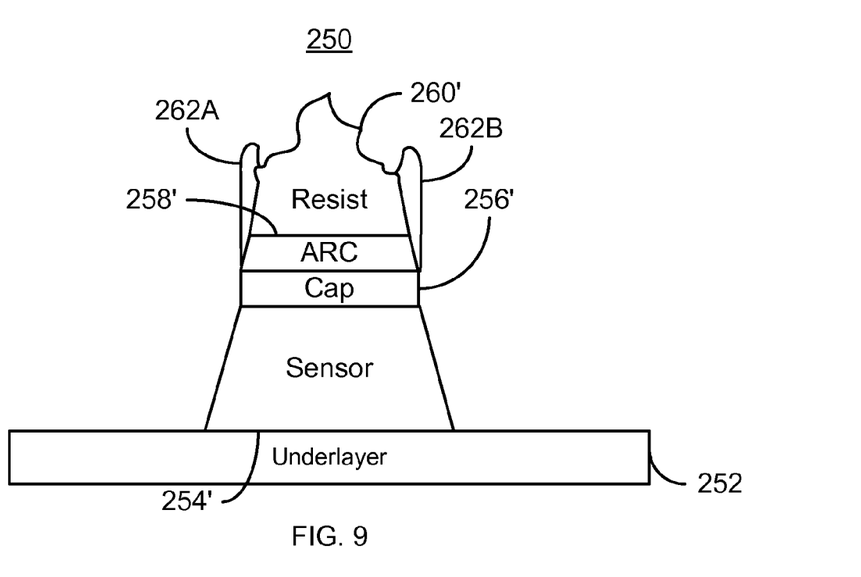
Figure 10:
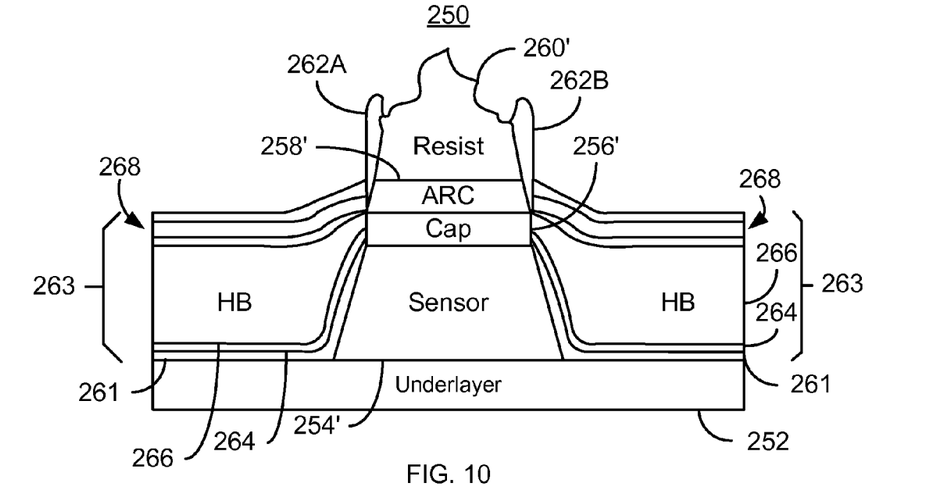

The magnetoresistive sensor is defined from the stack, via step 204. Step 204 typically includes forming a mask covering a portion of the magnetoresistive stack and removing an exposed portion of the magnetoresistive stack using ion milling. In other embodiments, another removal process such as a reactive ion etch (RIE) might be used. During this step, a portion of the layer(s) of the magnetoresistive stack is redeposited. Step 204 is thus analogous to step 102 of the method 100. FIG. 8 depicts an ABS view of the transducer 250 during step 204. In FIG. 8, the mask has been provided, but the magnetoresistive sensor has not yet been defined. Thus, magnetoresistive stack 253 including sensor layers 254 and capping layer 256. The magnetoresistive stack 253 resides on underlayer 252 is shown. The mask 257 includes an antireflective coating (ARC) 258 and photoresist 260. In other embodiments, the mask 257 may be a hard mask including metallic and dielectric materials. FIG. 9 depicts the transducer 250 after step 204 is completed. Thus, sensor 254' has been defined from the magnetoresistive stack 253. The capping layer 256' is also defined. A portion of the photoresist 260' remains, as does a portion of the ARC 258'. Fencing/redeposition 262A and 262B have been formed as artifacts of the process that defines the sensor 254'.

an insulating layer and hard bias structure(s) are provided, via step 206. Step 206 may be performed after defining the magnetoresistive junction in the track width direction. However, step 206 may be performed before or after defining the magnetoresistive junction in the stripe height direction. The hard bias structure(s) are substantially adjacent to the magnetoresistive junction in a track-width direction. Formation of the hard bias structures in step 206 generally includes depositing one or more seed layers, hard bias material(s), and a capping layer including one or more sublayers. For example, the capping layer may include a Ru/Ta or Ta/Ru bilayer or Ru/Ta/Ru or Ta/Ru/Ta trilayer. In some embodiments, such a capping layer has a thickness that does not exceed twenty nanometers. FIG. 10 depicts the transducer after step 206 is performed. Thus, insulating layer 261 and hard bias structures 263 have been formed. The hard bias structures 263 include seed layers 264, hard bias material(s) 266, and capping layers 268. The capping layers my include sublayers, which are shown but not separately labeled. A remaining portion of the photoresist mask 260' and ARC layer 258' may be removed, via step 208. Step 208 may be performed via a lift-off process. In other embodiments, step 208 removes the hard mask for example using an RIE.

Figure 11:
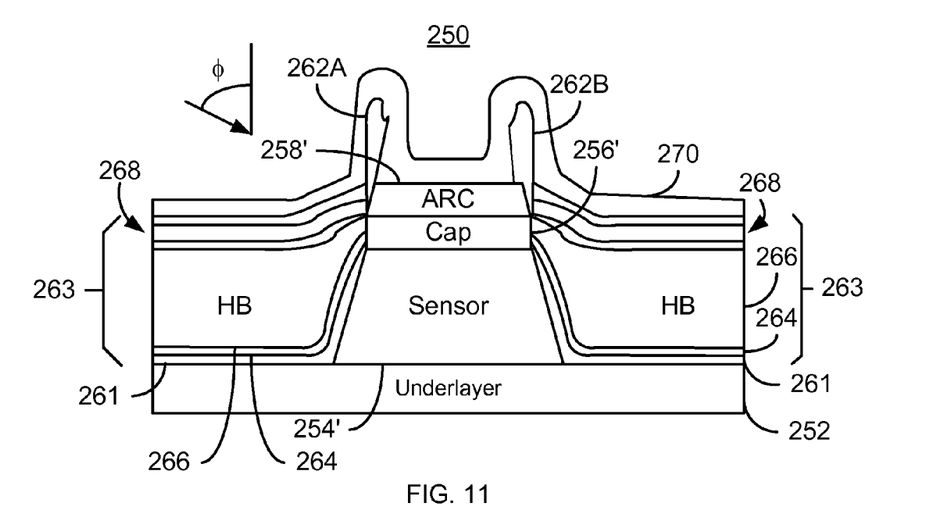

A sacrificial layer that covers the magnetic junction 254', the fencing/redeposition 262A and 262/b, and hard bias structures 263 is provided, via step 210. The sacrificial layer is solid and has an ion milling removal rate that depends upon the milling angle. For example, the sacrificial layer might include one or more of Ta, Ru, Ti, W, Cr, TiW, and Al$_2$O$_3$. FIG. 11 depicts the transducer 250 after step 210 is performed. Thus, photoresist 260' and ARC 258' have been removed. In addition, sacrificial layer 270 has been formed. As can be seen in FIG. 11, portions of the sacrificial layer 270 adjoining the sides of the fencing/redeposition 262A and 262B are nearly perpendicular in comparison with the portions of the sacrificial layer 270 on the top of the hard bias structures 263. In some embodiments, the sacrificial layer 270 has a thickness of at least ten Angstroms and not more than one hundred fifty Angstroms. In some such embodiments, the sacrificial layer 270 is at least twenty and not more than sixty Angstroms. In some embodiments, the sacrificial layer 270 might include sublayers. However, the sacrificial layer 270 is a single layer in FIG. 11.

The transducer 250 is milled at a milling angle for which the removal rate for the sacrificial layer 270 and the fencing/redeposition 262A and 262B is high and for which the removal rate for the complement of the milling angle is low, via step 212. FIG. 11 also depicts this milling angle, φ. In some embodiments, this milling angle is at least fifty degrees from a normal to a surface of the magnetic transducer 250 (i.e. normal to the plane of the layers 252, 254, and 266). In some such embodiments, this milling angle is at least seventy degrees. The sacrificial material 270 on the fencing/redeposition 262A and 262B and at least a portion of the underlying fencing/redeposition 262A and 262B are removed. However, the portion of sacrificial layer 270 on the top surface of the hard bias structures 263 helps to protect the capping layer(s) 268 from damage.

Figure 12:
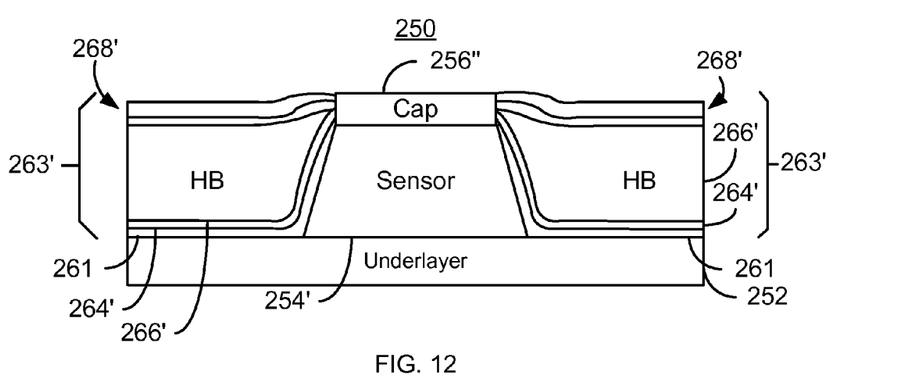

In at least some embodiments, the fencing/redeposition 262A and 262B are removed in step 212 without the use of a CMP. However, in other embodiments, the fencing/redeposition 262A and 262B might not be completely removed. Consequently, steps 210-212 may be optionally repeated until the fencing/redeposition is removed, via step 214. Thus, deposition of additional sacrificial layer(s) 270 may be alternated with milling the transducer 250 at an appropriate angle a particular number of times until the fencing/redeposition 262A and 262B are removed. As part of step 212 or 214, any remaining sacrificial layer 270 might be removed. FIG. 12 depicts the transducer after step 212 or 214 is completed. Thus, fencing/redeposition 262A and 262B have been removed via ion milling. A portion of the capping layer 256" remains and is now exposed. Further, some portion of the hard bias structures 263', such as capping layers 268' or may have been removed. However. The hard bias materials 266' and seed layers 264' remain undamaged and are protected by the capping layers 268'.

Using the method 200, fabrication of the transducer 250 may be improved. In particular, fencing/redeposition 262A and 262B may be removed using the ion beam planarization and without the use of a CMP. This removal may be accomplished substantially without damage to hard bias structures 263'. More specifically, corrosion due to exposure of portions of the hard bias structures 263' may be mitigated or prevented. Consequently, fabrication of the transducer 250 may be improved.

We claim:

1. A method for fabricating a magnetic transducer having a magnetoresistive stack, the method comprising:
   defining a magnetic junction from the magnetoresistive stack, the magnetic junction having a top and a plurality of sides, the step of defining the magnetic junction redepositing a portion of the magnetoresistive stack and forming fencing adjacent to the top of the magnetic junction;
   providing at least one hard bias structure after the magnetic junction is defined, a first portion of the at least one hard bias structure being substantially adjacent to the magnetoresistive junction in a track-width direction; and
   ion beam planarizing the magnetic junction, thereby substantially removing the fencing.

2. The method of claim 1 wherein the step of ion beam planarizing further includes:
   depositing a sacrificial layer covering the magnetic junction, the fencing, and the at least one hard bias structure, the sacrificial layer being a solid; and
   ion milling the transducer at an angle of at least fifty degrees from a normal to a surface of the magnetic transducer.

3. The method of claim 1 wherein the angle is at least seventy degrees.

4. The method of claim 2 wherein the sacrificial layer has an ion milling removal rate depending on the angle.

5. The method of claim 4 wherein the sacrificial layer includes at least one of Ta, Ru, Ti, W, Cr, TiW, and Al$_2$O$_3$.

6. The method of claim 2 wherein the step of ion beam planarizing further includes:
   depositing an additional sacrificial layer on the magnetic junction and the hard bais structure after the step of ion milling the magnetic junction; and
   performing an additional ion mill at an additional angle of at least fifty degrees from the normal to the surface after the additional sacrificial layer is deposited.

7. The method of claim 6 further comprising:
   optionally repeating the steps of depositing the additional sacrificial layer and performing the additional ion mill until the fencing is removed.

8. The method of claim 2 wherein the sacrificial layer has a thickness of at least ten Angstroms and not more than one hundred fifty Angstroms.

9. The method of claim 8 wherein the thickness is at least twenty and not more than sixty Angstroms.

10. The method of claim 1 wherein the fencing is removed without a chemical, mechanical planarization of the transducer.

11. The method of claim 1 wherein the step of defining the magnetic junction further includes:
   providing a mask corresponding to the magnetic junction;
   ion milling an exposed portion of the magnetoresistive stack, forming the magnetic junction.

12. The method of claim 1 wherein the step of providing the hard bias structure further includes:
   depositing at least one seed layer;
   depositing at least one hard bias material on the seed layer; and
   providing a capping layer on the at least one hard bias material, the capping layer having a thickness of not more than twenty nanometers.

13. The method of claim 12 wherein the step of providing the capping layer further includes:
   providing at least one of a Ta sub-layer and a Ru sub-layer.

14. The method of claim 11 further comprising:
   removing a remaining portion of the mask after the at least one hard bias structure is provided.

15. A method for fabricating a magnetic transducer having a magnetoresistive stack, the method comprising:
   providing a mask on the magnetoresistive stack corresponding to a magnetic junction;
   performing at least one of an ion milling and a reactive ion etch on an exposed portion of the magnetoresistive stack to define the magnetic junction, the magnetic junction having a top and a plurality of sides, the step of ion milling the magnetic junction redepositing a portion of the magnetoresistive stack and forming fencing adjacent to the top of the magnetic junction;

providing at least one hard bias structure after the magnetoresistive structure is defined, a first portion of the at least one hard bias structure being substantially adjacent to the magnetoresistive junction in a track-width direction, the at least one hard bias structure including at least one seed layer, at least one hard bias material on the at least one seed layer, and a capping layer on the at least one hard bias material, the capping layer having a thickness of not more than twenty nanometers;

removing a remaining portion of the mask after the at least one hard bias structure is provided;

depositing a sacrificial layer covering the magnetic junction, the fencing, and the at least one hard bias structure, the sacrificial layer having an ion milling removal rate depending on a milling angle, the sacrificial layer being solid and having a thickness of at least twenty Angstroms and not more than sixty Angstroms;

ion milling the transducer at an angle of at least seventy degrees from a normal to a surface of the magnetic transducer; and optionally repeating the steps of depositing the sacrificial layer and ion milling until the fencing is removed without chemically mechanically planarizing the magnetic transducer.

* * * * *